July 13, 1937. S. BALLANTINE Re. 20,442

AUTOMATIC CONTROL FOR AUDION AMPLIFIERS

Original Filed Nov. 5, 1927 4 Sheets-Sheet 1

Inventor:

Stuart Ballantine,

By Byrne, Townsend & Brickenstein, Attorneys

AUTOMATIC CONTROL FOR AUDION AMPLIFIERS

Original Filed Nov. 5. 1927 4 Sheets-Sheet 2

Inventor:

Stuart Ballantine,

By Byrne Townsend & Brickenstein

Attorney

AUTOMATIC CONTROL FOR AUDION AMPLIFIERS

Original Filed Nov. 5, 1927 4 Sheets-Sheet 3

Inventor

Stuart Ballantine,

By Byrne Townsend & Brickenstein,

Attorneys

Re. 20,442
July 13, 1937. S. BALLANTINE
AUTOMATIC CONTROL FOR AUDION AMPLIFIERS
Original Filed Nov. 5, 1927 4 Sheets-Sheet 4
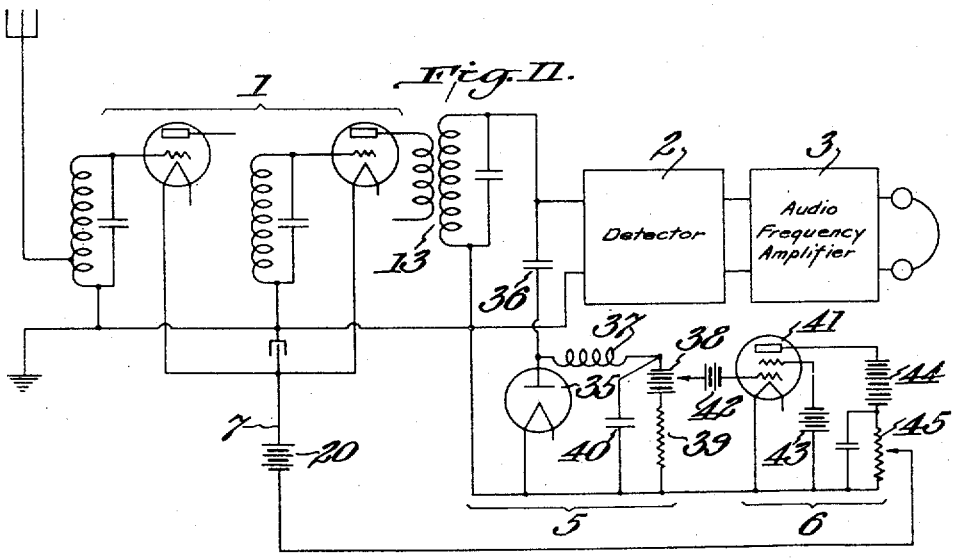
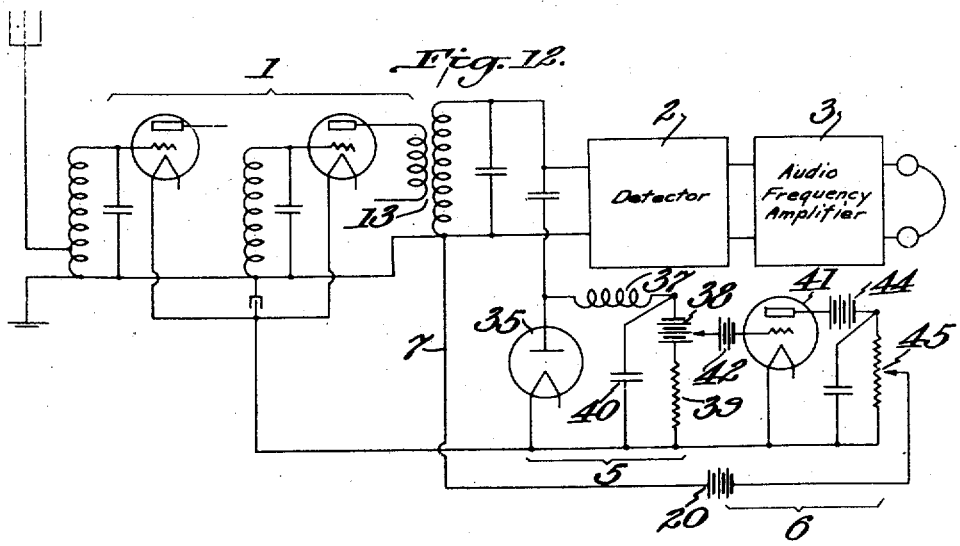
Inventor:
Stuart Ballantine
By Byrne, Townsend & Brickenstein,
Attorneys Reissued July 13, 1937 Re. 20,442

UNITED STATES PATENT OFFICE 20,442

AUTOMATIC CONTROL FOR AUDION AMPLIFIER

Stuart Ballantine, Mountain Lakes, N. J., assignor, by mesne assignments, to Radio Corporation of America, New York, N. Y., a corporation of Delaware Original No. 1,869,331, dated July 26, 1932, Serial No. 231,273, November 5, 1927. Application for reissue September 19, 1932, Serial No. 633,929

32 Claims. (Cl. 250—20)

This invention relates to an automatic control for audion amplifiers, and more particularly to control methods and apparatus for automatically maintaining the output of an amplifier constant in the presence of variations in the carrier wave energy impressed upon the input system of the amplifier.

In the reception of radio signals, variations in the electric field acting upon the collector of the radio receiver arise from natural and fortuitous causes and are commonly called "fading". Such variations are naturally not amenable to control and the irregular variation in the strength of the output is very undesirable in broadcast telephone reception and in other communications. Similarly, in the transmission of signals over land lines by means of carrier waves, variation in the attenuation may cause marked changes in the carrier wave energy which is impressed upon the amplifiers of the transmission line.

In accordance with the present invention, fluctuations in the output are suppressed or eliminated by automatically varying the rate of amplification of the radio frequency or carrier wave amplifiers in such a way that, as the signal strength increases, the amplification is reduced in amount sufficient to maintain a constant output.

In the following specification and claims, the term "signal strength" has reference to the significant input energy which, in the usual carrier wave systems of wired and wireless transmission of signals, is the carrier wave itself.

An object of the invention is to provide a method of and apparatus for automatically varying the amplification rate of an audion amplifier to suppress fluctuations in output due to variations in input energy. Further objects are to provide methods of and apparatus for suppressing fluctuations in the output of an audion amplifier by automatically varying the grid bias of one or more amplifying audions in accordance with variations of the input signal energy. More specifically, objects are to provide methods of and means for suppressing the effects of fading in radio transmission by varying the amplification of the radio frequency amplifier of a receiver in accordance with variation of the input signal energy.

Figure 1:
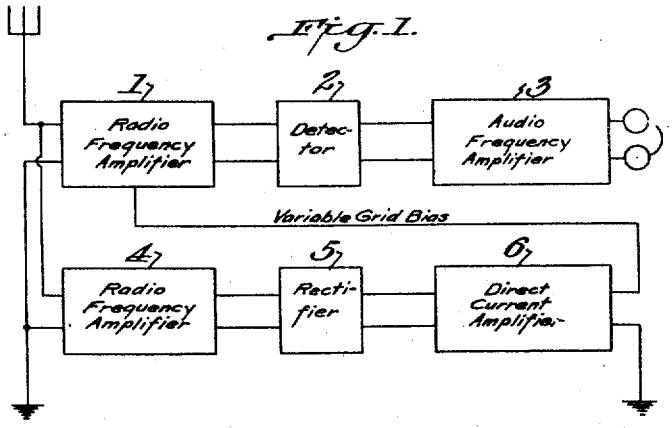
Figure 2:
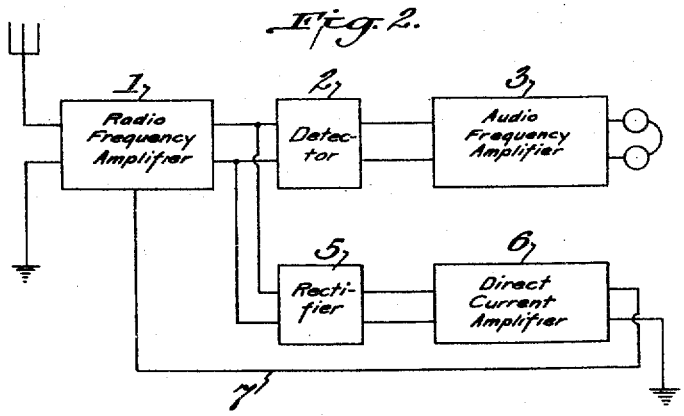
Figure 3:
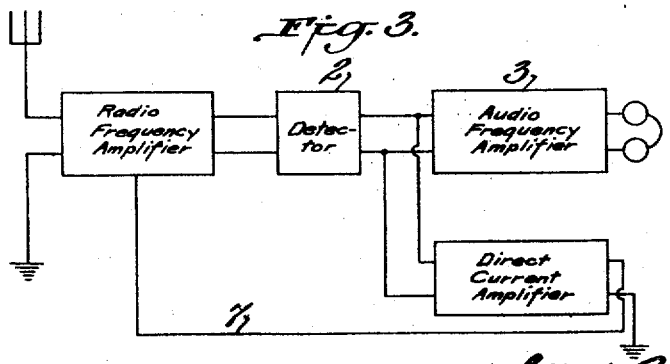

These and other objects of the invention will be apparent from the following specification when taken with the accompanying drawings, in which, Figs. 1, 2 and 3 are schematic views illustrating generic forms of the invention, Figs. 4, 5, 6 and 7 are diagrams showing certain characteristics of audion tubes, and Figs. 8, 9, 10, 11 and 12 are electrical diagrams of amplifier circuits embodying the invention.

In the drawings, Figs. 1, 2 and 3 are schematic diagrams representing the invention as embodied in apparatus for receiving the usual modulated carrier waves employed in radio broadcasting.

In Fig. 1, a conventional radio receiver is represented by the radio frequency amplifier 1, the detector 2 and audio amplifier 3. The auxiliary system which provides an automatic control consists generally of a radio frequency amplifier 4, a rectifier 5 and a direct current amplifier 6. The auxiliary system is in shunt with the receiver across the antenna and receives a portion of the incoming carrier-wave energy, from which is derived a direct current potential which is impressed as a grid bias upon the radio amplifier 1 through the connection 7.

The use of a separate radio frequency amplifier 4 and also of the auxiliary rectifier 5 is not essential as the radio amplifier 1 of the receiver and the detector 2 can be arranged to perform the functions of the corresponding auxiliary elements, proper means being provided to filter out alternating current components before impressing the output upon the direct current amplifier or upon the grids of the radio frequency amplifiers. The resultant reduction in the parts required for the auxiliary system is of considerable economic advantage in certain practical applications of the invention.

The diagram of Fig. 2 represents a radio receiver such as shown in Fig. 1, and an auxiliary system comprising the rectifier 5 and direct current amplifier 6, the rectifier receiving amplified signal energy from the output of the receiver radio frequency amplifier 1.

The diagram of Fig. 3 represents a further simplification of the general arrangement of Fig. 1, the direct current amplifier 6 in this case being connected across the detector 2.

Figure 4:
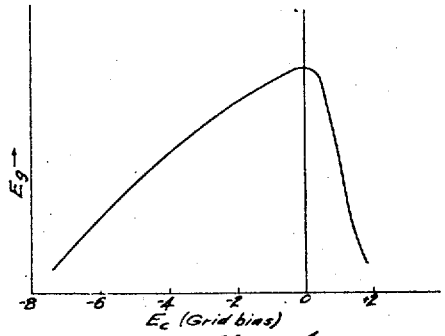

The method of operation will be described in connection with the system shown in Fig. 2. The curve of Fig. 4 is a graphical representation of the variation in the amplification in a four-stage one-way amplifier of the type shown in my copending application Serial No. 629,702, filed April 3, 1923, as the bias of the grids varied through positive and negative values. The values of $E_g$ represent the voltage across the input of detector 2 for varying values of $E_c$, the direct current bias on the grids of the radio frequency amplifier audions. The relationship may be expressed mathematically as:

$$Eg = A(Ec)\,Eo \qquad (1)$$

where Eo is the impressed voltage due to the wave field or incoming signal energy.

The grid bias is a function of the voltage Eg, the precise form of this function being determined by the characteristics of the rectifier 5 and direct current amplifier 6; that is $$Ec = f(Eg) \qquad (2)$$

Figure 5:
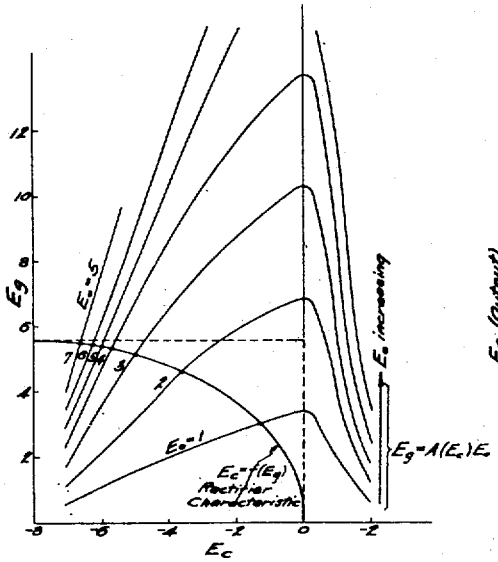

The exact values attained by Eg in view of the simultaneous action of Equations (1) and (2) may be found graphically as shown in Fig. 5. The intersections of the curves give the values of output voltages Eg, corresponding to the various impressed voltages, yielding the Fig. 6 solid line curve of input Eo versus output Eg for the whole system.

Figure 6:
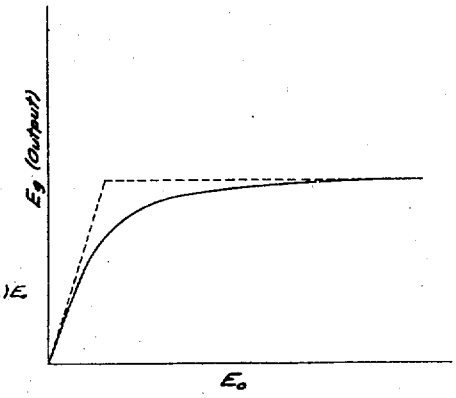

Ideal operation would give the broken line curve of Fig. 6, i. e., an increase in input energy would produce a corresponding increase in output until a critical output Tg is reached; the output not increasing thereafter with any increase in input energy. This ideal relationship would obtain if the rectifier action was such as to furnish the relationship between positive grid bias Ec and rectifier input Eg which is shown by the dotted line in Fig. 5. Such a rectifier is difficult to obtain in practice for it demands the characteristic shown in dotted line in Fig. 7, that is, one in which there is no output until the impressed voltage Eg increases to a critical value E at which the output suddenly rises. It is possible, however, to attain a practical approximation to this requirement, as shown by the solid line curve of Fig. 7, which gives satisfactory operation in accordance with this invention.

None of the known rectifiers possesses a sharp critical region for low impressed voltage amplitudes as all have a region of transition where it was customary to operate in the prior art on account of the necessity for large curvature with the small signals then available. It is possible, however, as described in the copending application of Ballantine and Hull, Serial No. 644,215, filed June 8, 1923, patented January 8, 1929, No. 1,698,668, to obtain a close approximation to discontinuous action with certain rectifiers by first amplifying the signals sufficiently; the amplification being of an order materially higher than that obtained in the usual practice, i. e., say from ten to one hundred times that ordinarily employed.

Figure 7:
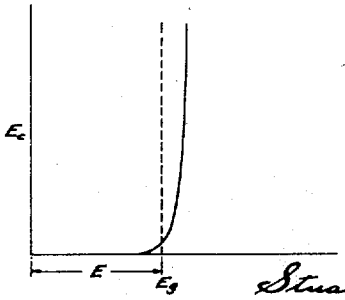

A characteristic such as shown in solid line in Fig. 7 may be obtained with commercial ferro-silicon alloys containing about 70% to 80% silicon and about 30% to 20% of iron, the contact point being iron pyrites ($FeS_2$) held in light contact with a sensitive spot in the ferro-silicon. A rectifier of this type will possess a critical point E which, when exceeded, will bring the rectifier into action. The critical point may be adjusted to secure various constant outputs. It will be noted that the response above the critical value is substantially linear, and this feature is particularly desirable in the systems of Fig. 3 to avoid distortion, but is not necessary in the systems of Figs. 1 and 2 so long as the rise of the characteristic curve above the vertical voltage is sufficiently steep.

Thermionic rectifiers of suitable design may be employed in place of the ferro-silicon and iron pyrite or ferro-silicon and metallic contact rectifiers. I have found that the lack of a sharp cut-off in the case of thermionic devices is due largely to the circumstance of the applied voltages being near the same order of magnitude as those corresponding to the emission velocities of the electrons, energy due to thermal agitation and the voltage corresponding to the work function of the metal, and also to the Maxwellian distribution of the velocities of the electrons, without increasing the applied voltage, somewhat better action may be obtained by decreasing the cathode temperature and providing a metallic vapor of low work-function, such as caesium, which emits copiously at low temperatures, but in general the preferred method of obtaining a sharp cut-off is by raising the applied voltages.

Referring again to Fig. 4, it will be seen the controlling grid bias may be either positive or negative and that on the positive side the control is somewhat better for a given change in Ec than on the negative side. The positive control, while more effective, is under some disadvantage due to the grid current which is permitted to flow in the radio frequency amplifier tubes. This extra conductance decreases the selectivity and may in some cases be found intolerable; in these cases the negative control may be used, the extra range of Ec required being obtained by suitable direct current amplification or increased rectifier efficiency.

Figure 8:
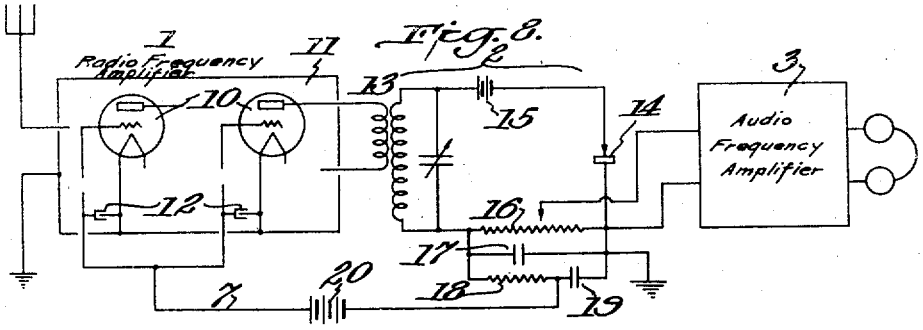
Figure 9:
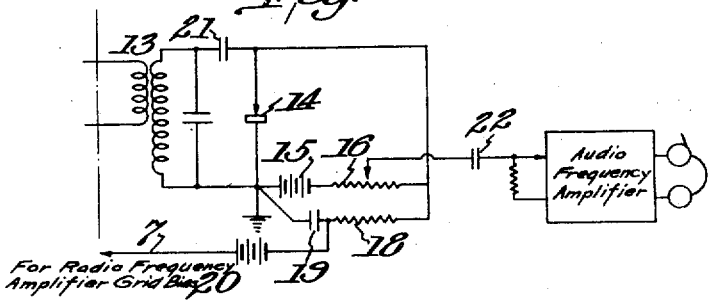
Figure 10:
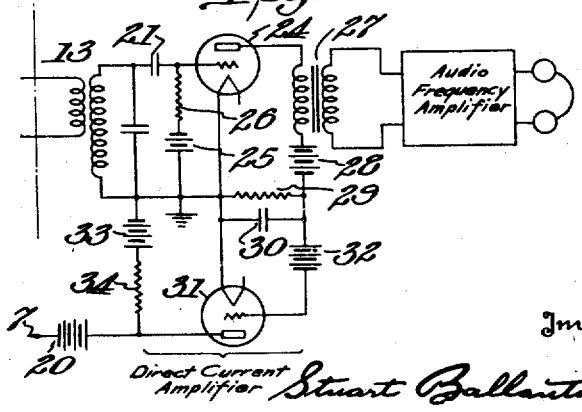

Practical embodiments of the invention as applied to radio receivers are shown in the circuit diagrams of Figs. 8, 9 and 10.

The circuit of Fig. 8 is an embodiment of the schematic arrangement shown in Fig. 3, but omitting the direct current amplifier of that system. The radio frequency amplifier unit 1 may be of any suitable design and is indicated as comprising a plurality of audions 10 which with their interstage coupling and tuning devices are arranged within a grounded shield 11. The grid returns of the several stages are preferably connected to the corresponding filament circuits by radio-frequency by-pass condensers 12, and the several grid returns upon which the variable bias is to be impressed are connected to the lead 7 from the automatic control unit.

The detector unit 2 of the receiver serves also as the rectifier unit of the control system, and is coupled to the amplifier unit 1 by a transformer 13. The detector 14 is preferably of the ferro-silicon and iron-pyrite type, and is connected across the transformer 13 through the bias battery 15, by which the critical voltage of the rectifier 14 is adjusted, and the resistor 16 which serves as a coupling for the audible alternating current components of rectification. The audio frequency amplifier unit 3 is connected across the resistor 16; a variable tap being provided for regulating the alternating current input.

To provide the variable direct current bias free from alternating current components, the resistor 16 is by-passed by condenser 17 of low radio frequency impedance; and a filter comprising the resistor 18 and condenser 19 is also connected across the resistor 16, the variable bias lead 7 being brought to the junction of filter elements 18 and 19. The impedance of the condenser 19 and other capacities in parallel with it is low for the audio frequency components. A battery 20 may be provided in the variable bias lead 7 to provide the normal grid bias in the absence of a signal, but this battery may often be omitted.

The diagram of Fig. 9 shows an alternative arrangement of the rectifier circuits. The amplifier unit is not shown in this diagram but may be of the type shown in Fig. 8. An isolating condenser 21 is arranged between the detector 14 and the input transformer 13 to prevent short circuiting of the detector output circuit by the transformer secondary. The detector output includes the bias battery 15, and the resistor 16, the audio frequency unit 3 being coupled to the resistor 16 through a variable tap. This connection may include an isolating condenser 22 when the direct current drop across resistor 16 due to the battery 15 does not provide the proper grid bias for the first tube of the audio amplifier. Under these circumstances, the grid leak 23 is employed with condenser 22 to provide the desired bias.

It will be apparent that a thermionic diode (two electrode) tube may be substituted for the crystal rectifier, the filaments being usually connected to the ground.

The circuit of Fig. 10 illustrates the generic circuit of Fig. 3, the rectifier in this case being a thermionic triode. The radio frequency amplifier is not shown and the circuit elements which are substantially identical with those of Figs. 8 and 9 are identified by the same numerals. The radio frequency transformer 13 supplies the thermionic detector 24 through the isolating condenser 21, the detector grid being biased by a battery 25 through the grid-leak 26. The alternating current components of the output is transferred to the audio frequency unit 3 by a low frequency coupling transformer 27. The plate circuit also includes a plate battery 28 and a resistor 29 for passing the direct current component to the direct current amplifier unit 6. The resistor 29 is shunted by a condenser 30 of low audio frequency impedance, which condenser keeps the alternating components from the direct current amplifier and also prevents the resistor 29 from interfering with the operation of audio transformer 27 at audio frequencies. The detector plate battery 28 may be located between the resistor 29 and the filament as well as in the position shown. The grid bias for the direct current amplifier 31 may be obtained from the potential drop across resistor 29 due to battery 28, by means of a separate bias battery 32, or by equivalent means. As shown, the plate circuit of the direct current amplifier is supplied by a separate battery 33, but it is obvious that this may be common with the other plate batteries. The direct current output is coupled to the grid returns by means of resistor 34, the lead 7 including a battery 20, if desired, for adjustment of the mean bias.

The tetrode or four electrode tube is a very convenient form of direct current amplifier as it yields a considerable amplification with low battery voltages. The method of substituting the tetrode for the triode shown in Fig. 10 will be obvious to those familiar with audion circuits.

The circuit diagram of Fig. 11 represents another embodiment arranged for negative control, that is, control by means of a negative bias on the radio frequency amplifier 1. The system is of the general type shown in Fig. 2; the radio receiver comprising the radio frequency amplifier 1, detector 2 and audio amplifier 3 and the control system comprising a separate rectifier 5 in parallel with detector 2, and a direct current amplifier 6. The rectifier element or diode 35 is connected across the transformer 13 through isolating condenser 36, and the output circuit of the rectifier includes a radio frequency choke 37, battery 38 and resistor 39 which may be about 25,000 ohms. The resistor 39 serves as a coupling to the direct current amplifier unit 6 and a by-pass condenser 40 is shunted across the battery 38 and resistor 39 to keep radio frequency currents from amplifier 6; the choke 37 preventing the condenser 40 from shorting the rectifier for radio frequency voltages. The battery 38 provides a means for adjusting the critical voltage of the rectifier 35.

The direct current amplifier element is shown as a tetrode 41 which has its control grid coupled to the rectifier output through a grid bias battery 42. The usual batteries 43, 44 supply the operating potentials and the output is developed in a resistor 45 of about 100,000 ohm resistance which is shunted by a condenser 46 of low reactance for audio modulation frequencies. The variable bias lead 7 is connected to resistor 45 by an adjustable tap, and preferably includes a battery 20 for placing a normal bias on the grids of the radio frequency amplifier 1.

It will be evident that this arrangement may be used for positive control, i. e., with the radio frequency bias varying positively instead of negatively, by omitting the direct current amplifier and connecting the bias lead 7 to the resistor 39 instead of to resistor 45 as shown.

The circuit of Fig. 12 illustrates an analogous arrangement but adapted for positive control. The symbols are for the most part uniform with those of the preceding figure and the parts have the same functions. In this case the filaments of the rectifier and direct current amplifier tubes are at ground potential with those of the radio frequency amplifier, thus permitting the use of common "A" batteries. Also a triode has been shown instead of the tetrode in the direct current amplifier. It will also be obvious that if the output tap is shifted from resistor 45 to resistor 39 the control changes from positive to negative.

Although the use of a rectifier having a sharp cut-off, and in some cases having a substantially linear characteristic above the cut-off voltage, is particularly desirable for close regulation and good quality, it will be apparent that some improvement in volume control may be had with rectifiers having other characteristics.

In general the use of a separate rectifier for control purposes is preferable to using the regular detector of the receiver for both purposes. The reasons for this have been given. A good combination is a linear detector at 2, and a linear rectifier at 5 with a cut-off characteristic. A linear rectifier at 5 without a cut-off characteristic is less useful for control purposes with a characteristic of the type shown in Fig. 4. The variable bias may be placed upon the detector stage or audio amplifiers in addition to or in place of the bias on the radio frequency amplifiers.

It will be apparent that the invention is capable of wide application with various types of audion amplifiers and that many circuits may be devised for effecting control by the principles which are described in this specification.

I claim:

1. An audion amplifier including an audion for signal wave amplification, an output circuit, and means suppressing fluctuations in said output circuit due to variations in the strength of an incoming signal, said means comprising a rectifier for incoming signal energy, means for impressing upon the grid of said audion a direct current bias voltage derived from said rectifier, and means for rendering the rectifier inoperative for input voltages below a predetermined value, said rectifier being of the type having an approximately linear relation between direct current output and radio frequency input above a critical input voltage.

2. In combination, an audion, an output circuit therefor, and means for suppressing fluctuations in said output circuit due to variations in the strength of an incoming signal, said means comprising a rectifier having a critical input voltage below which substantially no direct-current output is obtained, and means for adjusting said critical voltage.

3. In an electrical system, the combination with an audion having input and output circuits, of means for suppressing fluctuations in said output circuit due to variations in the strength of an incoming signal in said input circuit, said means comprising a rectifier of the type having an approximately linear relation between direct-current output and radio frequency input above a critical input voltage, and means for varying the critical voltage of said rectifier.

4. The combination with an audion, of means for biasing said audion by a direct-current voltage, means for automatically varying said bias voltage in accordance with the strength of an incoming signal, at least one of said means including a rectifier having a critical working voltage, and means whereby said critical voltage may be adjusted.

5. In a system for the transmission of modulated signals, the combination with an audion amplifier for amplifying said signals, and means automatically controlling the gain of said amplifier in accordance with the strength of received signals, of a demodulator, and means to suppress all output from said demodulator until the amplified signals impressed thereon reach a predetermined critical value.

6. The invention as set forth in claim 5, wherein said last means is adjustable to control the predetermined value of amplified signal strength below which no demodulator output is obtained.

7. In a receiver for modulated carrier waves, the combination with a radio frequency amplifier, and a demodulator having an audio frequency response substantially proportional to the strength of impressed signal voltages, of a linear rectifier for rectifying amplified radio voltages to produce a direct current voltage for automatically controlling the gain of said amplifier, and means for suppressing the direct current response of said rectifier for impressed radio voltages below a predetermined value.

8. The invention as set forth in claim 7, wherein said means is adjustable to control the predetermined amplified radio frequency value below which no gain control voltage is developed by said rectifier.

9. In a receiver for modulated carrier waves, a radio frequency amplifier, means for producing audio frequency and direct current voltages by rectification of amplified signals, means actuated by said direct current voltage to control the gain of said amplifier, and means suppressing the development of audio frequency and direct current voltages for impressed amplified voltages below predetermined values.

10. The invention as set forth in claim 9, wherein said rectification means has a linear response for impressed radio voltages above the predetermined value.

11. The combination in a receiver for carrier wave signals, of an audion amplifier, a linear rectifier upon which the amplified signal voltage is impressed, means including said rectifier for impressing a variable gain-control bias on said amplifier, said rectifier having a critical input voltage below which no rectified output obtains, and means for adjusting said critical input voltage.

12. The invention as set forth in claim 1, in combination with a detector for demodulating amplified signals, said detector and said rectifier being connected in parallel across said audion output circuit.

13. The invention as set forth in claim 1, wherein said rectifier comprises a thermionic rectifier of the diode type, and in combination with a demodulator connected in parallel with said rectifier across said audion output circuit.

14. The invention as set forth in claim 7, wherein said demodulator and said rectifier are connected in parallel across said signal frequency amplifier.

15. The invention as set forth in claim 7, wherein said rectifier is a diode, and the input terminals of said rectifier are connected across the input of said demodulator.

16. In a radio receiver of the automatic gain control type, the combination with a radio amplifier, of a combined detector-rectifier stage working out of said amplifier to develop both modulation-frequency and direct current voltages; said stage comprising a detector-rectifier device having two terminals, an input impedance and an output resistance serially connected between the terminals of said device, said input impedance being coupled to said amplifier; means for impressing on the amplifier a bias voltage derived from the direct current potential drop established across said output resistance, and circuit connections for impressing upon an audio frequency load circuit the audio frequency voltage developed across said output resistance.

17. In a radio receiver of the automatic gain control type, the combination with a radio amplifier, of a rectifier having two terminals, a radio frequency impedance and a condenser serially connected between said terminals, said impedance being coupled to said amplifier to serve as a source for impressing radio voltages on said rectifier, an output resistance effectively connected across said condenser, circuit elements for returning to the amplifier as a gain-control bias the direct current voltage developed across said resistance, and an audio frequency load circuit working out of said resistance.

18. In a radio receiver, a two element rectifier, a radio frequency circuit and a blocking condenser serially connected between said elements, a resistance and a radio frequency choke serially connected between said elements to constitute a conductive output path for rectified currents, and means shunted across said resistance to prevent the development of radio frequency voltages across the same.

19. The invention as claimed in claim 18, in combination with a direct current voltage source included in said output path to impress a bias voltage between said rectifier elements to prevent rectification for all radio input voltages below a predetermined value.

20. The method of governing the output of an electrical amplifying system which consists in deriving from the amplifying system an alternating electromotive force proportional to the output of the system, combining this alternating electromotive force with a direct electromotive force, deriving from the combination a governing electromotive force depending on the excess of the alternating electromotive force over the direct electromotive force, and using the governing electromotive force to regulate the gain of the amplifying system.

21. The method of governing the output of an electrical amplifying system which consists in deriving from the amplifying system an alternating electromotive force proportional to the output of the system, combining this alternating electromotive force with a direct control electromotive force of controllable value, deriving from this combination a governing electromotive force depending on the excess of the alternating electromotive force over the control electromotive force, using the governing electromotive force to regulate the gain of the amplifying system and adjusting the control electromotive force and thereby determining the output level of the system.

22. The method of governing the output of an electrical amplifying system which consists in deriving from the system an alternating electromotive force proportional to the output, superimposing this alternating electromotive force on a direct electromotive force, deriving by rectification a floating charge depending on the excess of the alternating electromotive force over the direct electromotive force and utilizing this floating charge to regulate the gain of the amplifying system.

23. The combination with an electrical amplifier of means for deriving from the amplifier an electromotive force dependent on the output of the amplifier, means for combining this electromotive force with a direct electromotive force, means for receiving the combined electromotive force, a condenser in which a floating charge is thus excited, and means whereby this floating charge regulates the gain of the amplifier.

24. An automatic governor for electrical amplifiers wherein are combined means for deriving from the amplifier an alternating electromotive force whose value depends upon the output of the amplifier, a rectifier and a capacity connected in series relation, whereby the capacity acquires a floating charge by rectification of the alternating electromotive force, and means for utilizing the floating charge to control the gain of the amplifier.

25. An automatic governor for electrical amplifiers wherein are combined means for deriving from the amplifier an alternating electromotive force whose value depends upon the output, a rectifier, a capacity, means for impressing the alternating electromotive force on said rectifier and capacity in series, whereby a floating electromotive force is set up by rectification, and a regulator element operated by such floating electromotive force whereby the gain of the amplifier is regulated.

26. An automatic governor for electrical amplifiers wherein are combined means for deriving from the amplifier an alternating electromotive force whose value depends on the output of the amplifier, a rectifier, a source of direct electromotive force, a capacity connected in series relation with the two electromotive forces and the rectifier whereby the capacity acquires a floating charge by rectification of the resultant electromotive force, and means for utilizing the floating charge to control the gain of the amplifier.

27. An automatic governor for electrical amplifiers wherein are combined means for deriving from the amplifier an alternating electromotive force depending upon the output, means for superimposing this output electromotive force on a direct electromotive force, means for rectifying the excess of the output electromotive force over the direct electromotive force, a governor element in which a floating electromotive force is set up by such rectification, and a regulator element operated by such floating electromotive force whereby the gain of the amplifier is regulated.

28. An automatic governor for electrical amplifiers wherein are combined a rectifier, a condenser, means for deriving from the amplifier an alternating electromotive force whose value depends upon the output, means for impressing said electromotive force on the rectifier, means for exciting a floating charge in the condenser by rectification of the excess of said electromotive force above the floating charge, and means controlled by the floating charge for regulating the gain of the amplifier.

29. An automatic governor for electrical amplifiers wherein are combined a rectifier, a condenser, means for deriving from the amplifier an alternating electromotive force whose value depends upon the output, means for impressing said electromotive force on the rectifier, means for exciting a floating charge in the condenser by rectification of the excess of said electromotive force above the floating charge, means controlled by the floating charge for regulating the gain of the amplifier, and means whereby the floating charge is slowly dissipated when the output electromotive force decreases, thereby restoring the gain of the amplifier.

30. In a signaling system, an amplifier including an amplification control element, a device comprising two rectifying electrodes, an input circuit including said two rectifying electrodes and means for transferring signals from said amplifier to said rectifying electrodes, a conductive circuit connecting said signal transferring means and one of said rectifying electrodes, and including a resistor, and means including said resistor for supplying control energy derived from the action of said rectifying electrodes upon said signals, to said amplification control element.

31. The combination with a radio amplifier, of a detector system and a rectifier system working in parallel out of said amplifier, one of said systems comprising a diode, means including said rectifier system for impressing a bias voltage on said amplifier, and means rendering one of said systems inoperative for impressed radio voltages of less than a predetermined critical value.

32. The combination with a radio amplifier, of a detector system and a rectifier system working in parallel out of said amplifier, one of said systems comprising a diode, means including said rectifier system for impressing a bias voltage on said amplifier, and means applying to one of said systems a bias voltage to render the same inoperative for impressed radio voltages of less than a predetermined critical value.

STUART BALLANTINE.